(12) United States Patent
Kalinov et al.

(10) Patent No.: US 10,909,301 B2
(45) Date of Patent: Feb. 2, 2021

(54) METHOD AND APPARATUS FOR DETERMINING WAIVER APPLICABILITY CONDITIONS AND APPLYING THE CONDITIONS TO MULTIPLE ERRORS OR WARNINGS IN PHYSICAL VERIFICATION TOOLS

(71) Applicant: Cadence Design Systems, Inc., San Jose, CA (US)

(72) Inventors: Alexey Kalinov, Moscow (RU); Douglas Den Dulk, Apex, NC (US); Andrey Freidlin, Zhyukovskiy (RU)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/741,252

(22) PCT Filed: Jun. 29, 2017

(86) PCT No.: PCT/RU2017/000466
§ 371 (c)(1),
(2) Date: Dec. 30, 2017

(87) PCT Pub. No.: WO2019/004853
PCT Pub. Date: Jan. 3, 2019

(65) Prior Publication Data
US 2020/0143100 A1  May 7, 2020

(51) Int. Cl.
*G06F 30/00* (2020.01)
*G06F 30/398* (2020.01)
*G06F 16/23* (2019.01)
*G06F 30/31* (2020.01)

(52) U.S. Cl.
CPC ........ *G06F 30/398* (2020.01); *G06F 16/2379* (2019.01); *G06F 30/31* (2020.01)

(58) Field of Classification Search
CPC .......................... G06F 30/398; G06F 16/2379
USPC ........................................................ 716/112
See application file for complete search history.

(56) References Cited

U.S. PATENT DOCUMENTS

| | | | |
|---|---|---|---|
| 8,694,937 B2 | 4/2014 | Tetelbaum et al. | |
| 10,592,634 B1 * | 3/2020 | Baranwal | G06F 30/398 |
| 2005/0188336 A1 * | 8/2005 | Mortensen | G06F 30/33 |
| | | | 716/106 |

(Continued)

OTHER PUBLICATIONS

International Search Report and Written Opinion dated Feb. 5, 2018 for PCT Appln. No. PCT/RU2017/000466.

*Primary Examiner* — Suchin Parihar
(74) *Attorney, Agent, or Firm* — Vista IP Law Group, LLP

(57) ABSTRACT

An approach is described for determining waiver applicability conditions and applying the conditions to multiple errors or warnings in physical verification tools. According to some embodiments, the approach includes identification of a waiver of an error or warning, registration of one or more condition sets for waiver of an error or warning, waiver of multiple errors or warnings that match the registered one or more condition sets, and further comprise any or all of the following: receiving or retrieving a circuit design, analyzing the circuit design to identify errors and warnings, and displaying identified errors and warnings where errors and warnings matching a registered condition set are waived. This approach provides for a 1-to-many relationship between identification of a waiver and application of waivers.

20 Claims, 12 Drawing Sheets

(56) References Cited

U.S. PATENT DOCUMENTS

| | | | |
|---|---|---|---|
| 2012/0167028 A1* | 6/2012 | Ferguson | G06F 30/398 716/112 |
| 2012/0297352 A1* | 11/2012 | Filippi | G06F 30/398 716/112 |
| 2013/0074016 A1* | 3/2013 | Loh | G06F 30/398 716/52 |
| 2013/0132918 A1* | 5/2013 | Ferguson | G06F 30/398 716/112 |
| 2013/0263074 A1* | 10/2013 | Ferguson | G06F 30/398 716/112 |
| 2015/0324510 A1 | 11/2015 | Aggarwal et al. | |
| 2018/0096093 A1* | 4/2018 | Graur | G06F 30/398 |

* cited by examiner

METHOD AND APPARATUS FOR DETERMINING WAIVER APPLICABILITY CONDITIONS AND APPLYING THE CONDITIONS TO MULTIPLE ERRORS OR WARNINGS IN PHYSICAL VERIFICATION TOOLS

CROSS REFERENCE TO RELATED APPLICATION(S)

This application is a 371 of international PCT Application No. PCT/RU2017/000466, filed on Jun. 29, 2017, which is hereby incorporated by reference in its entirety for all intended purposes.

BACKGROUND

Computer aided design (CAD) tools are often used for creating electronic designs such as systems, chips, and other logical representations of items to be created under certain rules or conditions. An electronic design automation (EDA) system is one type of CAD tool for creating electronic designs. Generally, CAD tools allow users to interface with programs in order to create and verify designs, e.g. for users to edit and modify configurations of objects displayed on a screen. In many of these CAD programs the user selects an object and manipulates or edits the object using a pointing device such as a mouse pointer, an input device such as a keyboard, or by providing files as inputs into the CAD program.

EDA tools are often used for performing design rule compliance verification, and/or correction of design rule violations, where the EDA tools provide processes whereby design rules are reviewed. The rules (e.g. conditions) enforced by the EDA tools include, for example, enforcement of performance parameters, spacing requirements between objects, overlap or contact between objects (e.g. connections to various parts of a net), and other rules relevant to positioning and interconnection between objects in relation to a substrate or other support structure.

Modern electronic devices are often made using the aforementioned EDA tools. This is necessitated in part by the infrastructure that is used in the manufacture of these devices and in part because of the size of the elements that make up these devices, e.g. nanometer level features. However, as the feature size of elements generated with these tools has decreased, the number of distinct elements has increased. As a result, modern semiconductor devices and the designs which are used in their manufacture will often have millions if not billions of transistors.

When EDA tools are used for designing and verifying large designs it is possible that the EDA tools will identify a large number of errors or warnings. For example, a memory chip having 64 megabits of memory having at least that many transistors, and additional transistors and connections to provide for routing and communication of signals between the various parts of the completed chip. As a result, the memory chip design may include thousands if not millions of design rule violations that have to be addressed before the device is manufactured.

Current EDA tools provide little in the way of helping a design or test engineer review such a vast quantity of violations. Instead, these tools simply provide a list of violations and engineers must review these violations individually. Such a review method is prohibitively time consuming and fails to utilize the unique talents of engineers.

Therefore, what is needed is an improved approach that provides an engineer a way to address generated rule violations without requiring the engineer to individually review each and every error or warning generated by the design during the design rules compliance and verification process.

SUMMARY

Embodiments of the present invention provide an improved approach for determining waiver applicability conditions and applying the conditions to multiple errors or warnings in physical verification tools.

According to some embodiments, the approach includes an identification of a waiver of a design rule violation (e.g. error or warning), such as a waiver received from an engineer using a graphical user interface, from a file associated with the design (e.g. design specific waiver conditions created manually or from a previously received waiver), or from another source. Upon identification of the waiver of a design rule violation a set of conditions are identified that are associated with that waiver. The waiver conditions are generated based on the conditions associated with the instance of block master for which the violation is being waived. These conditions may comprise external conditions corresponding to the inputs and/or outputs connected to the instance, the hierarchy of the instance with regard to other instances within which the instance is nested, or any other relevant condition. Once the conditions are identified they are registered in a data set (e.g. file, relational database entry, linked listed, etc.) for future application to other instances of the same block master. The conditions can then be used to automatically waive violations that are sufficiently similar such that they match the registered conditions. This approach provides for a 1-to-many relationship between identification of a waiver and application of waivers.

Other additional objects, features, and advantages of the invention are described in the detailed description, figures, and claims.

BRIEF DESCRIPTION OF FIGURES

In order that the present invention is better understood, some embodiments of the invention will now be described, by way of example only, with reference to the accompanying drawings.

DETAILED DESCRIPTION

Embodiments of the present invention provide a system, method, and product for implementing an improved approach for determining waiver applicability conditions and applying the conditions to multiple errors or warnings in physical verification tools.

Figure 1:
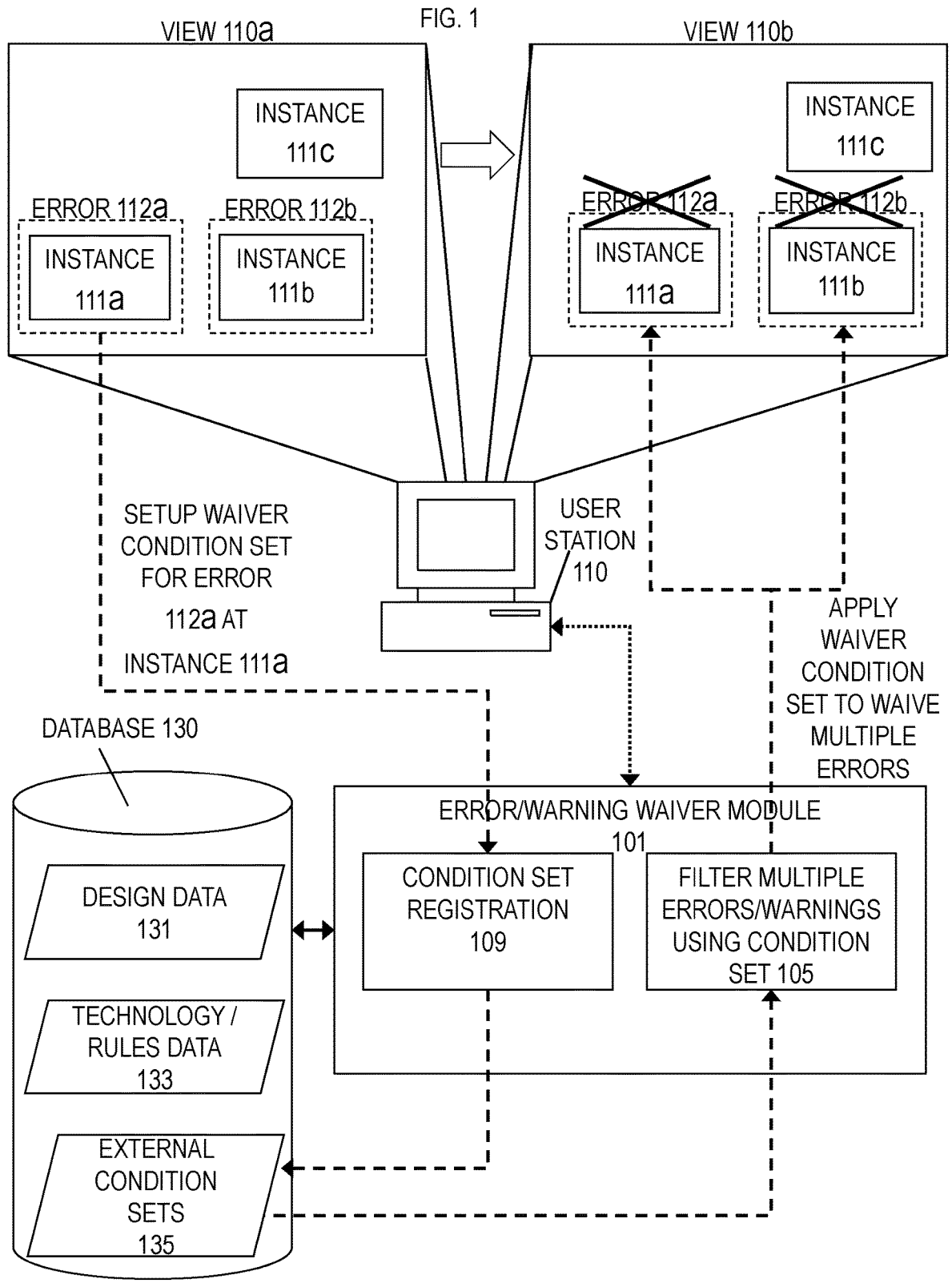
FIG. 1 depicts an example system for determining waiver applicability conditions and applying those conditions to multiple errors or warnings in physical verification tools according to some embodiments of the invention.

FIG. 1 depicts an example system for determining waiver applicability conditions and applying those conditions to multiple errors or warnings in physical verification tools according to some embodiments of the invention.

View 110*a* and view 110*b* provide a simplified illustration of an application of conditions for using conditions associated with a single waiver of a violation to waive multiple violations. Generally, the system identifies a design rule violation (e.g. errors or warnings) at the level of an instance of a design block master that is to be waived and uses the conditions for the identified instance of the design block master (block) as a set of conditions to determine if similar design rule violations should be waived for other instances of the same block. The design block masters are aggregations of other circuit elements and/or instances of design block masters that may be repeated numerous time within a design and may also contain other instances of other blocks within them. Thus, the instances of the blocks may comprise a multilevel hierarchy of instances including other blocks, and the instances may be associated with one or more errors or warnings at different levels within the hierarchy.

View 110*a* represents an initial view of a portion of a layout area that includes a set of objects (instances 111*a-c*). The instances 111*a-b* comprise different instances of the same block master, while instance 111*c* comprises an instance of a different block master. As illustrated, errors are associated with some of the instances, such as error 112*a-b*. In some embodiments, the error 112*a* for block 111*a* is identified as being one that is waivable, e.g. base on type, how far the violation deviates from a specified normal range, or some other factor. Once an error associated with an instance is identified the processes will setup a waiver condition set based on at least the identified error e.g. condition set registration 109 is used to setup and register a waiver condition set for error 112*a* at instance 111*a* by recording a waiver condition set associated with the design block master for instance 111*a* as part of the external condition sets 135. The condition set incorporates various parameters associated with the instance of the block such as external connections between the instance and other elements or any parameters of those external connections. In some embodiments, the condition set also incorporates the position of the instance within the hierarchy of the design.

Subsequently, other errors can be filtered at 105 by applying the external condition sets 135 to matching errors of instances that have the same block master, e.g. filtering and automatically waiving other errors that meet the registered waiver condition set for other instances of the same block. Thereby, waiving both error 112*a* and error 112*b* by applying the waiver condition set to waive multiple errors as illustrated in view 110*b*. In some embodiments, the approach disclosed herein is predicated on a determination that the selected error is one that is allowed to be waived before processing to determine conditions upon which other similar errors are to be waived.

The system includes a database 130 which is illustrated as including design data 131, technology/rules data 133, and external condition sets 135. The database 130 could be a single database with one or more subsets within that database for the design data 131, technology/rules data 133, and external condition sets 135, as illustrated in the figure. However, in other embodiments the database could comprise multiple separate databases on different computing systems and/or in different locations connected via electronic communication links (e.g. wired and wireless networks). The system may further include database access modules for accessing and storing the data, whether stored at a single database or multiple databases.

The design data 131 generally includes information related to aggregated sets of smaller technological elements and rules associated with those aggregated sets (herein: design block masters). However, while the technology is discussed in the context of the block level and corresponding enforcement requirements for a collection of elements, e.g. higher lever representations of a plurality of smaller elements collected or organized into a particular design, in some embodiments the design rules also apply to elements that are subsets of the blocks. By way of example, circuit layout of individual elements (gates and traces) can be represented by instances of blocks. Multiple instance of a block master can be repeated numerous times within a given design. Furthermore, instances can also be aggregated into other instances in a hierarchical relationship. For example, an instance of a memory array block of a memory chip includes a plurality of sub-block instances comprising individual banks of memory within the memory array block instance, the memory bank block instances in turn include additional sub-block instances comprising sets of memory cells, and finally the sets of memory cells comprise pluralities of individual memory cell block instances. Thus, the design data 131 can include data representing the hierarchy, relationships, and interconnections between and through multiple instances of individual block masters.

The technology/rules data 133 generally includes at least the necessary technology information and rules associated with designing a device for manufacture on the target technology such that the technology/rules data provides the necessary logic for identifying one or more rule violations as part of generating errors and/or warnings where appropriate. In one example, the technology information includes at least a series of parameters describing minimum widths, such as gate and trace widths, and other process parameters. In another example, the associated rules include various spacing parameters, such as minimum spacing between gates, traces, power plains/rails and minimum overlap for vias or other circuit/routing elements. In yet another example, the technology/rules data 133 include rules specifying how and in what way instances of blocks can be interconnected and/or nested.

The external condition sets 135 include data representing the relationship between individual violations, whether errors or warnings, and under what circumstances those violations should be waived. In some embodiments, the relationships between the individual errors/warnings and when they should be waived, e.g. an external condition set, is associated with individual block masters. For example, a waiver of an error corresponding to an input into an instance of a block is associated with the master for that instance of the block. Thus, an external condition set is associated with a block master and is applied to all similar errors for instances of the same block master and results in a waiver of those errors when the external condition set is satisfied.

User station 110 includes or provides access to the error/warning waiver module 101. The user station 110 executes instructions for performing design entry and review of an electronic design according to some embodiments of the invention. The user station 110 comprises any type of computing station that is useable to operate or interface with the database 130. Examples of such user stations include workstations, personal computers, or remote computing terminals. The user station 110 comprises a display device, such as a display monitor, for displaying a user interface to users at the user station. The user station 110 also comprises one or more input devices for the user to provide operational control over the user station, such as a mouse or keyboard to manipulate a pointing object in a graphical user interface.

The error/warning waiver module 101 includes various components or modules. The modules comprise either physical modules, logical modules stored in memory for execution by a processor, or some combination thereof, such as the ones illustrated herein (see FIG. 1 items 105 and 109) and any other appropriate modules as are known in the art in order to provide the underlying processes necessary for performing the various aspects as disclosed herein. In addition to condition set registration 109 and filter multiple errors/warnings using condition set 105 the error/warning waiver module 101 may include database access modules for interpreting data collected for database 130 and for managing and/or accessing layout data either locally, remotely, or some combination thereof. In some embodiments, the error/warning waiver module 101 includes an input control module for providing the option to manipulate one or more objects and to address one or more rule violations, including a rule violation identifier and a display module for displaying/reviewing/correcting rule violations.

Conditions set registration 109 comprises elements for identifying the conditions under which an error or warning is to be waived, and registering those conditions within a database, such as database 130 in the external condition sets 135. In some embodiments, the conditions are identified based on the values or ranges of various parameters. For example, parameters could be specified by a user at the completion/creation of the design block master, parameters could be identified based on a default set of parameters or parameter rules, parameters could be created or modified at the time of waiver either by default, a default set of rules, or a user, parameters could also be identified based on at least a portion of the technology/rules data 133, or any combination thereof, whether in part or in whole. The parameters themselves comprise attributes of connections or lack thereof between a block and the external conditions of those connections (e.g. a first input connected to a net with a voltage parameter having a specified value or range). For instance, parameters comprise input voltage, frequency, signal encoding, minimum/maximum current, logic level, logic type, signal type (e.g. digital or analog) or any other relevant parameter. In some embodiments, the parameters comprise information pertaining to the position/hierarchy of the block in which the error or warning is generated. Thus, parameters include the specific position within a hierarchy and the types of blocks that make up that hierarchy. For instance, a condition set for the waiver of an error at an instance of block 3 is only applied when the instance of block 3 is within an instance of block 2, and the instance of block 2 is within an instance of block 1. However, the error will not be waived if the instance of block 3 is within an instance of only block 1 or block 2, or any other variations that are not the same.

The filter block 105 for filtering multiple errors/warnings using registered conditions sets applies the registered condition sets to the design being analyzed. For example, a memory chip including millions of instances of a particular block where each of those blocks has essentially the same error (e.g. voltage on pin 1 is below the specified threshold in the technology/rules data) would have millions of instances of the same error. Waiving each error would be unduly burdensome to an engineer who is likely already pressed for time. Instead, using embodiments disclosed herein, an engineer may review one such error and therein determine that the particular error should be waived under the circumstances for that particular instance. As a result, condition set registration 109 would register an external condition set specifying when such an error should be waived for the particular block master associated with the instance. The Filter 105 will use the registered external condition set to analyze other errors in the design and when the same error is found for other instances of the same block master, the filter will determine whether the conditions match those specified by the registered external condition set and waive those found to match. Thus, the filter will waive multiple errors/warnings using the registered external condition set.

In some embodiments, the external condition sets 135 are persistent with respect to a design, and subsequent analysis of the design to determine compliance with the technology/rules data 133 is filtered using filter 105 and previously registers waiver condition sets. Thus, the process provides for iterative review, correction, and modification of a design, where previous condition sets carry over to the modified circuit such that an engineer would not be required to provide the same waivers after each iteration of the design rules compliance analysis.

An example illustration of the operation of aspects of FIG. 1 are provided in FIGS. 5A-G.

Figure 2:
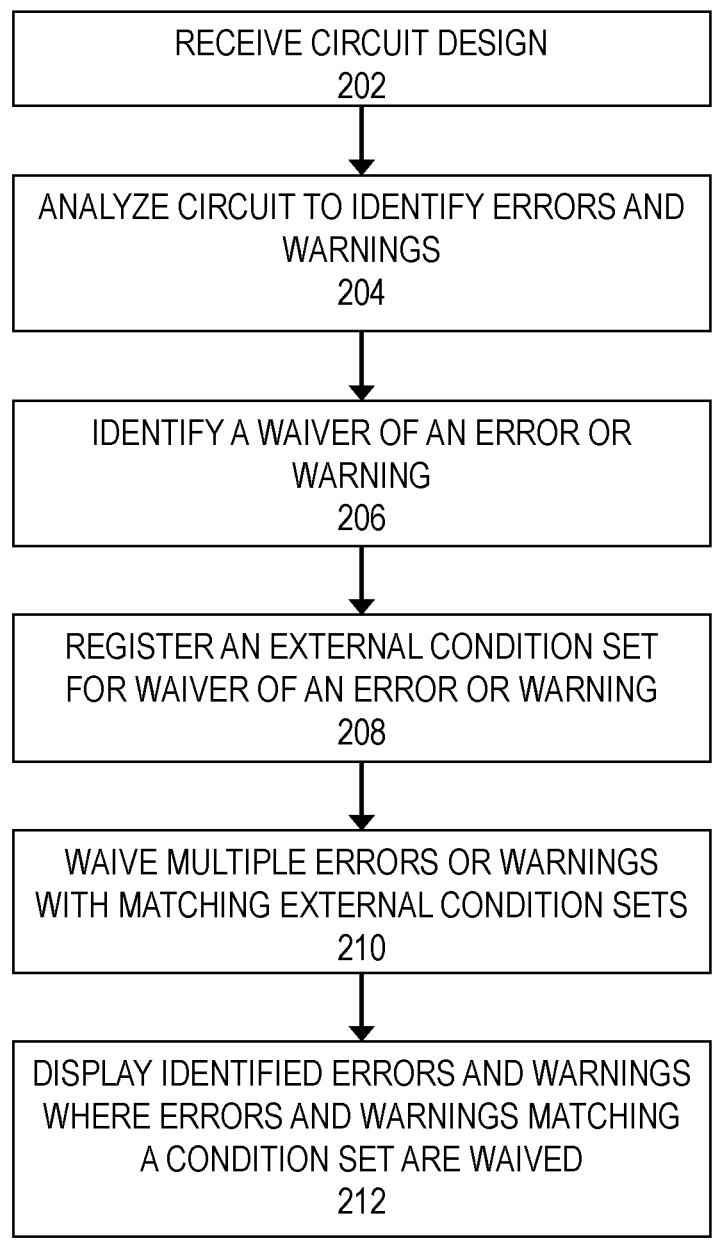
FIG. 2 illustrates a flow of an approach for determining waiver applicability conditions and applying those conditions to multiple errors or warnings in physical verification tools according to some embodiments of the invention.

FIG. 2 illustrates a flow of an approach for determining waiver applicability conditions and applying those conditions to multiple errors or warnings in physical verification tools according to some embodiments of the invention.

The process starts are 202 where the circuit design is received. The circuit design is received in any appropriate way as is known in the art. For instance, the circuit design could be received from a database that is stored locally on the same device where the design is received. The circuit design could also be received from a local network, a remote network/server, an external device (e.g. Universal Serial Bus storage device, external hard drive, etc.). The circuit design could also be received from one or more programs executing upon the device such as from or within electronic design and verification tools.

Once the circuit design has been received, the circuit design is analyzed at 204 to identify any errors or warnings. For instance, the circuit design could be processed by a design verification tool using the design data 131 and the technology/rules data 133 to determine whether any of the portions of the design violate one or more of those rules, or whether the circuit design includes aspects that violate engineering guidelines. Wherein a rule violation results in an error, and a guideline violation results in a warning. The results of the analysis are stored in cache, in volatile memory, in non-volatile memory, or some combination thereof.

The process continues at 206 where a waiver of an error or warning is identified. A waiver comprises an exception to the particular design rule violated or design guideline not followed for the particular error or warning being waived. In some embodiments, the waivers originate from a user (e.g. from a user on a user console), from another source such as an automated program or module that applies specific rules to the errors and warnings already generated, or from a database that previously stored individual waivers.

Once the indication of the waiver is received a waiver condition is setup by registering an external condition set for waiver of an error or warning at 208. This process is discussed in more detail in regard to FIG. 3 below. Briefly, the process includes identifying the external conditions associated with the block that are determined to be relevant, e.g. based on any combination of the technology/rule data, the design data, the block master, the user waiving the error or warning, or another user such as the user that designed the block master, or based on a set of logic for determining what parameters are relevant to individual errors or warnings.

Figure 4:
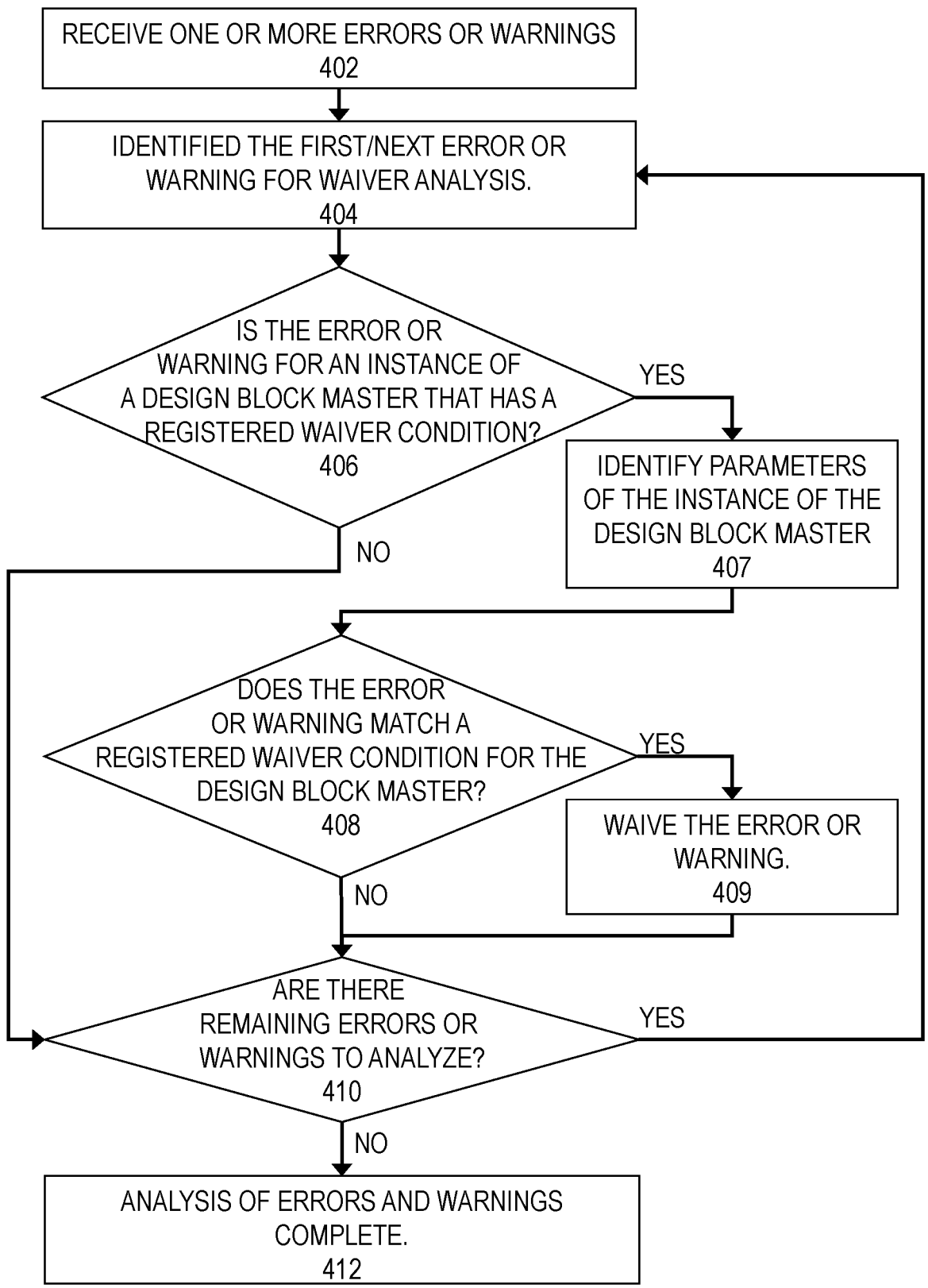
FIG. 4 illustrates a flow of an approach for waiving multiple errors or warnings using external condition sets.

The actual waiver of multiple errors or warnings is effectuated at 210 using one or more previously registered condition sets. Similar to the step discussed in the previous paragraph, this step is also discussed in further detail in a subsequent figure (FIG. 4). Summarily speaking, the multi-waiver process of 210 is effected through application of the registered external condition sets to the errors or warnings identified in 204 such as by processing each respective error and/or warning to determine whether they match to a particular condition set associated with a given block master of which a block is an instance.

At 212 the identified errors and warnings are displayed where the errors and warnings matching registered condition sets are waived. For instance, the waived errors are hidden or separated from the unwaived errors or warnings, such that the user can ignore or hide all waived errors or warnings without requiring a one-to-one action to error/warning relationship. In some embodiments, the waived errors and warnings are also hidden/displayed using a single hotkey combination or with a few clicks of the mouse regardless of the number of errors or warnings that where waived.

Figure 3:
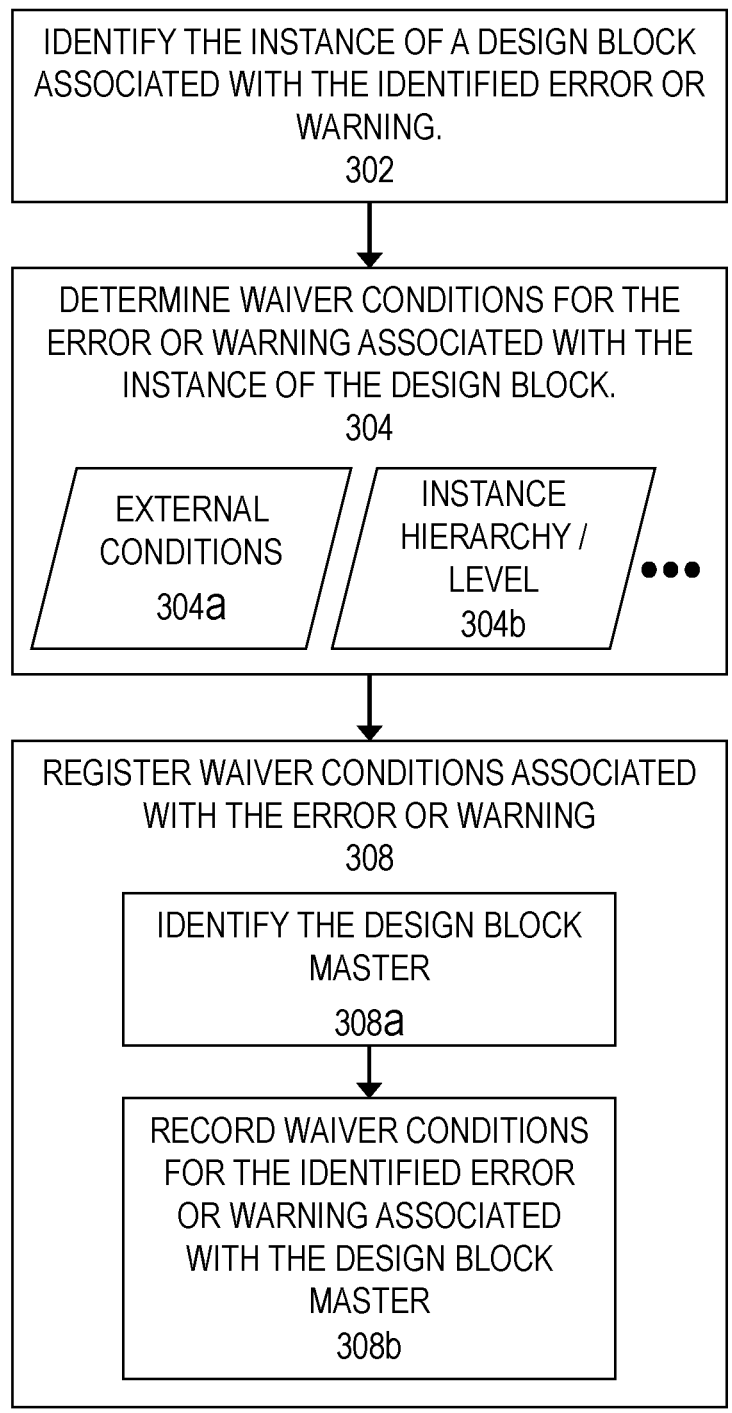
FIG. 3 illustrates a flow of an approach for registering external condition sets for waiver of errors or warnings according to some embodiments of the invention.

FIG. 3 illustrates a flow of an approach for registering external condition sets for waiver of errors or warnings according to some embodiments of the invention.

The process starts at 302 where the instance of the block associated with the identified error or warning is identified. This can be performed in any appropriate manner, such as by passing error or warning identifiers to the process and accessing a database to retrieve identification information. In some embodiments, the retrieval is triggered by a direct user action such as an input received using a GUI that specifies that a waiver should be applied, from data stored in a database that indicates waiver is appropriate, as the result of an output from a logical process that uses a rule base to determine when a waiver is appropriate, or any combination thereof.

Once the instance is identified in 302 the process can determine the waiver conditions for the error or warning associated with the instance of the block master at 304. This can be accomplished by conversion of appropriate parameters into a list of conditions that when met would indicate that a waiver should be applied. One such set of conditions are the external conditions 304*a* to the identified instance of the block master. For example, the conditions might include the voltage range of an input to the block, the type of input connected to the block, the minimum/maximum current of that input, the frequency, logical value, signal shape (e.g. sinusoid or square wave), whether any particular input is or is not connected, the signal name or portion thereof (e.g. the signal includes "sup" as at least part of its name indicating that it is a supply input), or any other relevant parameter.

Generally, the values for these parameters can be determined by querying the design data such as simulation data or other data specifying parameters of the net. In some embodiments, all possible parameters are required by the waiver condition. In such cases the applicability of the waiver would be limited to virtually identical uses to errors or warnings for other instances of the block master. However, in many cases only some parameters are relevant. For instance, for an over or under voltage error triggered at a data input to an instance of a block master the relevant parameters might comprise the other data inputs to the block and the supply voltage, but not include inputs such as a clock input, or control inputs. Selection of the parameters for inclusion in the external condition sets may be specified at various time. For example, the selected parameters may be determined by, any combination of, a user specifying the parameters at the time the block master is designed, a user specifying the parameters at the time the particular occurrence of the error is indicated for waiver, an automated system that determines the parameters included in the external conditions (e.g. by processing the technology/rules data to identify and include the parameters used in determining if there is an error or warning that should be generated). In some embodiments, the user is given the option to override any of the selected parameters for use in the external conditions to either include or exclude the from the determination.

In some embodiments, the external conditions 304*a* and the block hierarchy/level 304*b* are included as a condition for waiver. For instance, a condition set requiring at least that the position of the instance of the block master within a hierarchy of nested blocks is the same for waiver to be applicable to other instances of the same block master. Thus, if an error is found at an instance of block 3 that is within an instance of block 2 which is itself in an instance of block 1, then the error to be waived must also be found at an instance of block 3 that is within an instance of block 2 which is itself in an instance of block 1. Furthermore, other parameters of conditions could be used such as design level conditions (e.g. process technology and processing frequency range).

The process is completed at 308 where the waiver conditions associated with the error or warning are registered. This can generally be completed in two steps. First, the block master is identified for the instance of block at 308*a*. This can be completed through any known method, such as by querying a database (e.g. database 130) that includes the design data or passing the data into the condition set registration process (e.g. condition set registration 109) such as using modules for controlling and interfacing with the user interface. The condition set for the waiver of the identified error or warning can be recorded for the waiver conditions in a database such that the waiver condition set is associated with the block master at 308*b* (e.g. in a list or table that is part of or linked with the block master). Thus, providing for the future lookup of any waiver condition sets that might apply to an error or warning at an instance of a block by querying data associated with that instances block master.

FIG. 4 illustrates a flow of an approach for waiving multiple errors or warnings using external condition sets. The process begins when one or more errors or warnings are received, and executes a loop until the received one or more errors or warnings are processed. The loop comprises a first step for identifying the first/next error or warning for waiver analysis, a second step for determining if the error or warning is for an instance of a design block master that has a registered waiver condition set, a third step for identifying the parameters of the instance of the block master, a fourth step for determining if the error or warning matches a registered waiver condition for the block master, a fifth step for waiving the error or warning when indicated, and a sixth step for determining if there are additions error or warnings to analyze.

At 402 one or more errors or warnings are received. The errors or warnings are received from the design verification process, as a result of polling a dataset representing the design errors or warnings, triggered as a result of a user action, or received from a process trigger by condition set registration 109. Regardless of how the errors or warnings are received such as individually or as a group, the process continues at 404 where the first/next error or warning is identified for waiver analysis. The errors and warnings are identified singularly, or as a group such as in a list of errors and warnings for processing. In some embodiments, the errors and warnings are grouped, sorted, or otherwise organized in any appropriate manner (e.g. by block master).

At 406 it is determined whether the error or warning is for an instance of a block master that has a registered waiver condition set associated with it. This can be completed by first identifying the block master for the instance of the block, and second determining whether block master is associated with a registered waiver condition set. In some embodiments, this is completed by first maintaining the condition set data in relational database tables where block masters can be identified and using a lookup query to determine if an individual block master is associated with a registered condition set.

If the block master associated with the error or warning is not also associated with a registered waiver condition the process continues are 410. However, if the block master associated with the error or warning is also associated with a registered waiver condition the processes continues are 407 where the parameters of the instance of the block master are identified. In some embodiments, identified parameters are limited to those that are used as in the registered condition sets associated with the block master. In some embodiments, all external parameters and the instance hierarchy level are identified, or some combination thereof.

Once the parameters are identified the values of those parameters can be compare to the registered condition sets associated with the block master at 408. In some embodiments, the registered condition sets are tied to respective errors or warnings, such that the violation recited in the error or warning must be for the same violation as originally identified as either a precondition for applying the registered condition set or as part of the condition set. If the values of the parameters match (e.g. satisfy) any of the registered conditions sets as determined at 408, the error or warning will be waived at 409, otherwise if none of the values of the parameters satisfy any of the registered conditions sets the error or warning will not be waived. Regardless of waiver or lack thereof, the process will continue at 410 where it is determined whether there are any remaining errors or warnings to analyze, and if so the process returns to 404 where the next error or warning will be identified and subsequently processed and so on, until all the errors or warnings are processed and the process of analysis and the errors and warnings in completed at 412.

Furthermore, the aspects of the embodiments discussed above may be performed in any combination whether separately or as a whole utilizing any of the above described aspects.

ILLUSTRATIVE EXAMPLES

This document will now describe an illustrative example in a computer aided design (CAD) system, such as an electronic design automation (EDA) system for implementing an electronic design. Such systems typically include a graphical user interface that allows a designer to manipulate electronic components and design elements for electronic designs.

Generally, to design an integrated circuit, an electronic designer first creates high level behavior descriptions of the IC device using a high-level hardware design language. An EDA system typically receives high level behavior descriptions of the IC device and translates this high-level design language into netlists of various levels of abstraction using a computer synthesis process. A netlist describes interconnections of nodes, cells, and/or components on the chip and includes information of circuit primitives such as transistors and diodes, their sizes and interconnections. For example, an integrated circuit designer uses a set of EDA application programs to create a design layout from a logical circuit design, where the layout includes various instance of blocks that are repeated and/or nested within other instance of blocks. This nesting provides for a hierarchical relationship between the various block instances such that a block instance may have within it other block instances and some or all of those other block instances may have additional block instances within them and so on. The instances themselves generally comprise instances of block masters where each instance is a copy of a respective block master internally, but externally is connected and placed in different ways, e.g. instances of a block 1 within a single design are placed in instances of a block 5, a block 7, and a block 9. Block masters are created using both high level behavior descriptions or are designed manually using circuit layout, or some combination thereof. Finally, the instances of the blocks are generated as specified by high level language or as created in or match to a high level design language description in an EDA system layout function.

FIGS. 5A-G provide an illustrative example of determining waiver applicability condition sets and applying those condition sets to multiple errors or warnings in physical verification tools according to some embodiments of the invention.

Figure 5A:
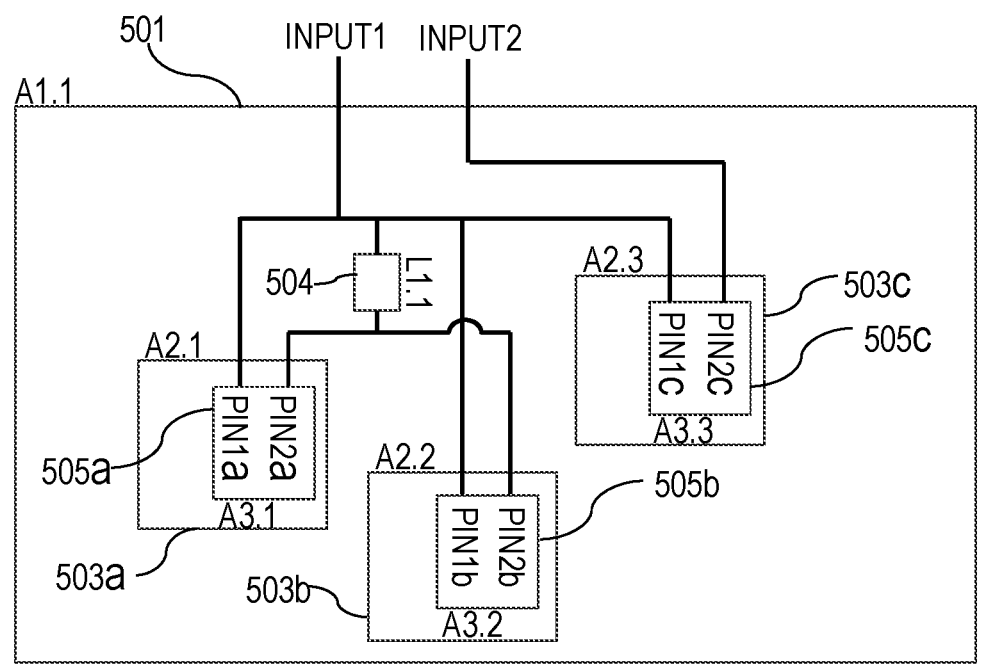
FIGS. 5A-G provide an illustrative example of determining waiver applicability conditions and applying those conditions to multiple errors or warnings in physical verification tools according to some embodiments of the invention.

FIG. 5A provides an illustration of an initial layout having instances of four block masters. The system provides an illustration of an example layout before design rules compliance analysis or without design rules compliance information illustrated.

The block masters include A1, A2, A3, and L1. A single instance of Block A1 is provided as A1.1 (501). There are three instances of block master A2 labeled A2.1 (503a), A2.2 (503b), and A2.3 (503c). Because, A2.1, A2.2, and A2.3 are all instances of the same block master (A2) they are all the same internally though they are not all connected in the same way externally. Blocks A2.1, A2.2, and A2.3 include at least an instance of block master A3 as blocks A3.1 (505a), A3.2 (505b), and A3.3 (505c) respectively. Finally, there is a single instance of the block master L1 labeled L1.1 (504).

The figure further illustrates connections between the inputs (input1 and input2). The inputs are connected externally to block A1.1 (501), which internally connects them to the nested blocks within A1.1 (501). As shown, input1 is connected to pin1a of 505a, pin1b of 505b, and pin1c of 503c, through their parent instances blocks A2.1, A2.2, and A2.3 respectively. Input1 is also connected to L1.1 (504) and L1.1 has an output that is connected to pin2a of 505a, and pin2b of 505b through A2.1 and A2.2 respectively. Finally, input2 is connected to pin2c of 505c through A2.3.

In some embodiments, the instances of the blocks and the block masters are associated with a plurality of other inputs and outputs. Some or all of the other inputs and outputs will be relevant to determining under what conditions a waiver should be applied. However, in the interests of illustrations we have limited the illustrated connections to those shown.

Figure 5B:
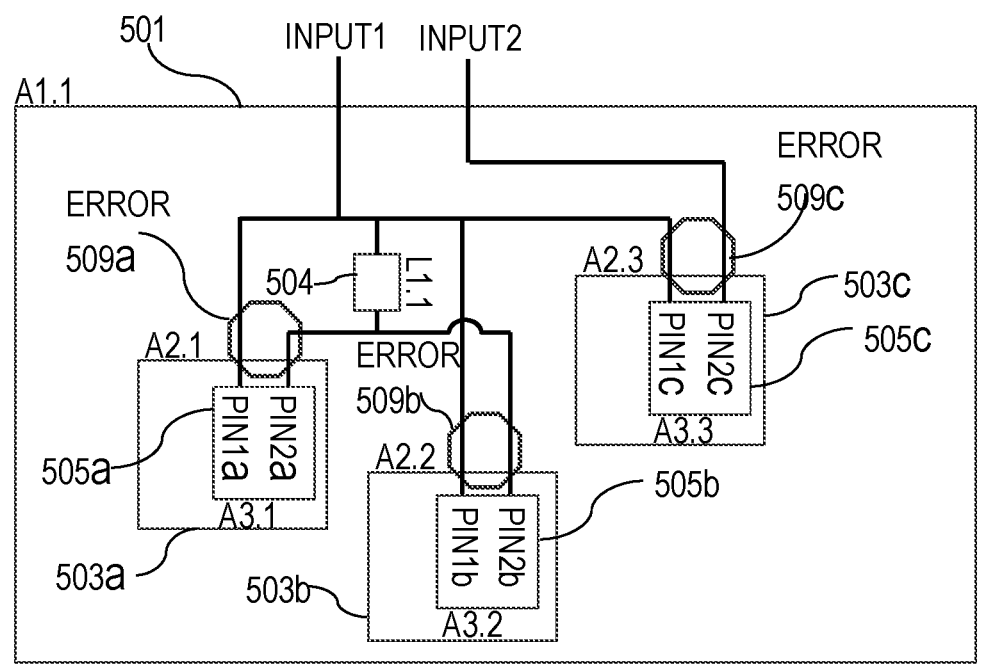

FIG. 5B illustrates the system after analysis for design rules compliance corresponding to 204 illustrated in FIG. 2. The illustration shows errors 509a-c which are reported at the level of the instances of the block master A2. In some embodiments, the errors are reported at different levels of the design. The errors are illustrated at the level the instances of the block master A2. The errors 509a-c comprise the same error (design rule violation), e.g. wrong input type, over or under voltage, over or under current, etc. For the purpose of this illustration we presume that errors 509a-c are an under-voltage error reported at the level of A2 though the effect of the violation will occur at the level of A3.

Figure 5C:
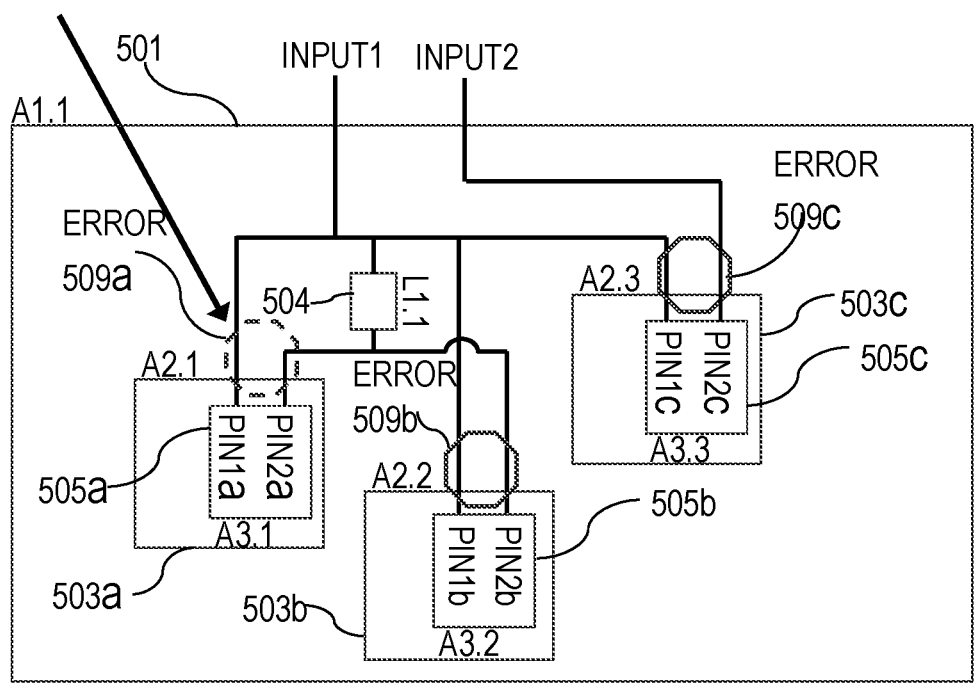
Figure 5D:
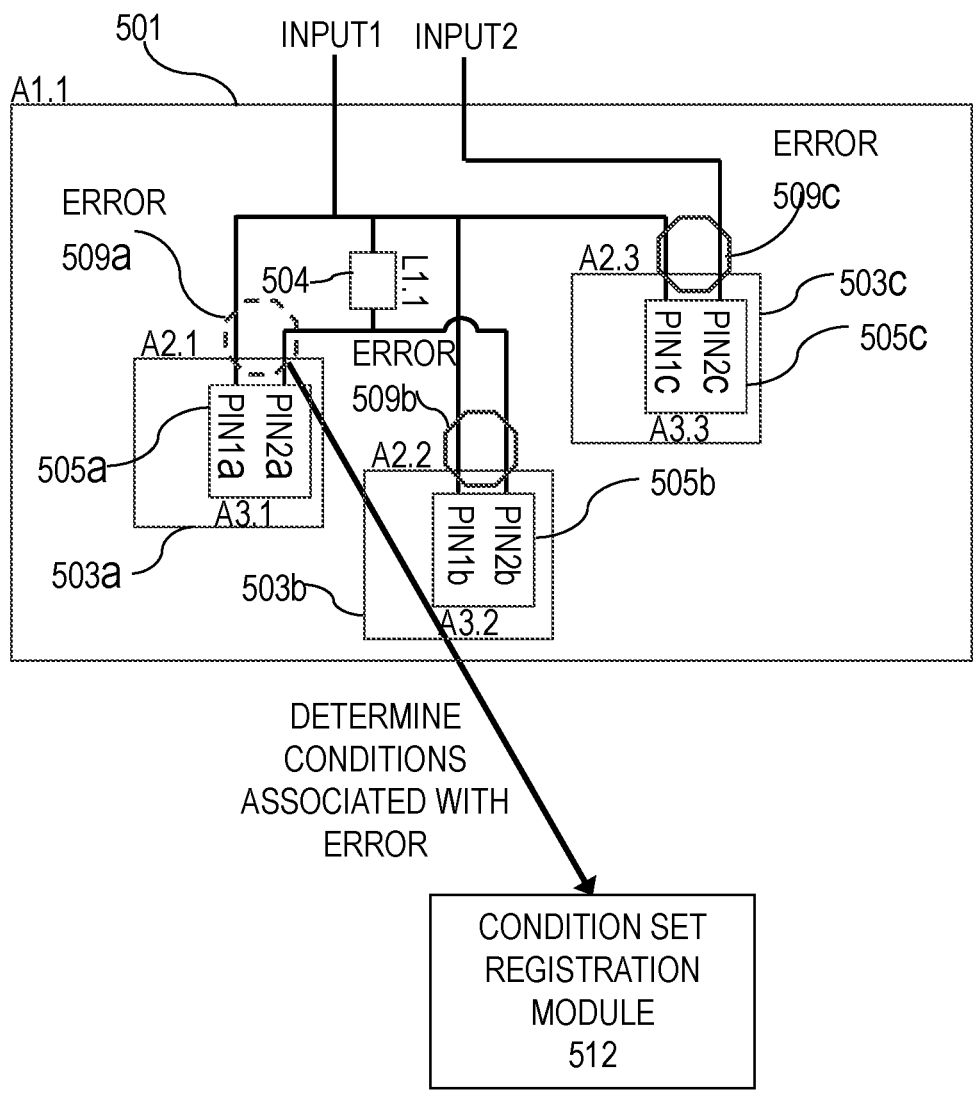
Figure 5E:
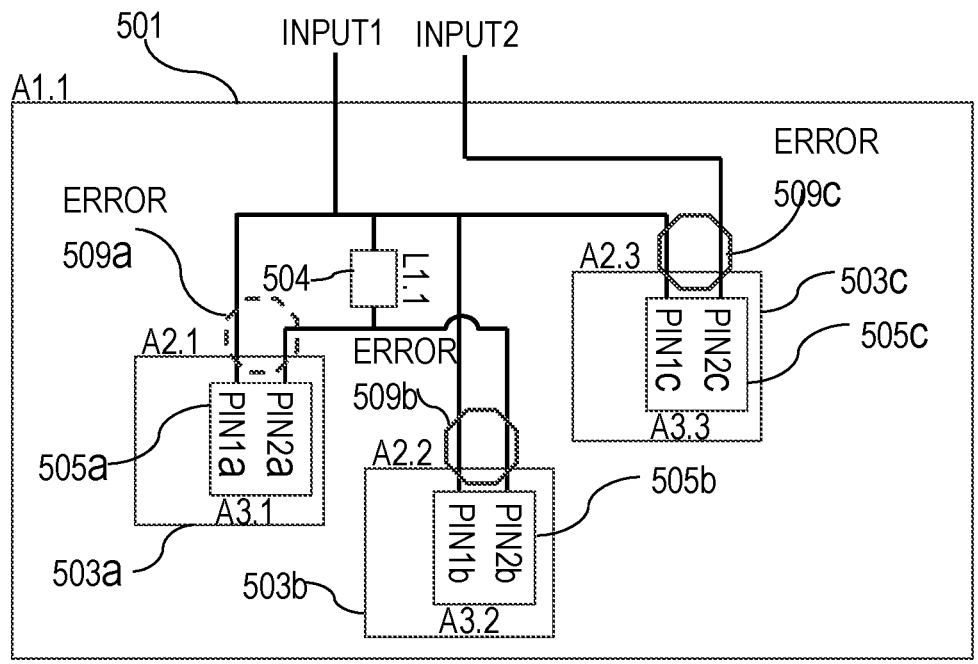
Figure 5E:
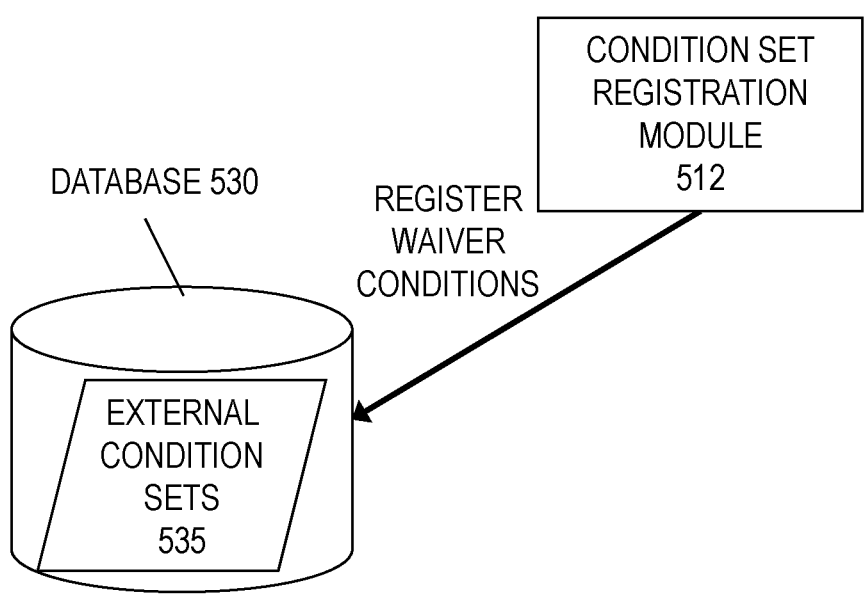

FIG. 5C illustrates the initiation of a waiver of the error at 509a and corresponds to 206 of FIG. 2. The initiation causes the determination of the conditions associated with the error as shown in FIG. 5D such as by a condition set registration module 512, and corresponds to 208 in FIG. 2, and 302 and 304 of FIG. 3. Finally, FIG. 5E illustrates the registration of the waiver condition set in database 530 which corresponds to database 130 as part of the external conditions sets 535 which correspond to 135. The actions of FIG. 5E correspond to 208 of FIG. 2 and 306 of FIG. 3.

Figure 5F:
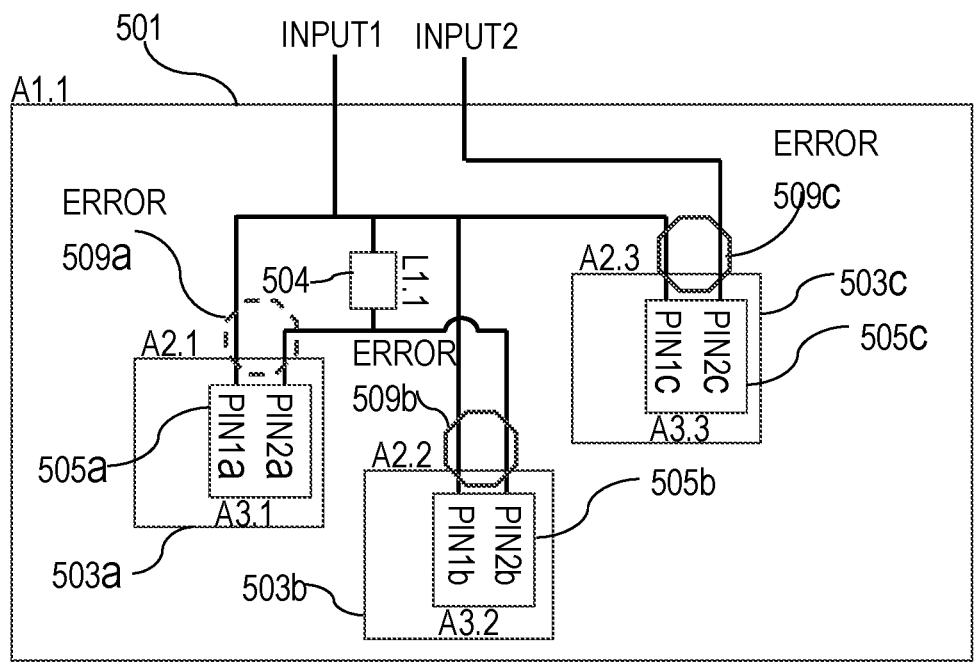
Figure 5F:
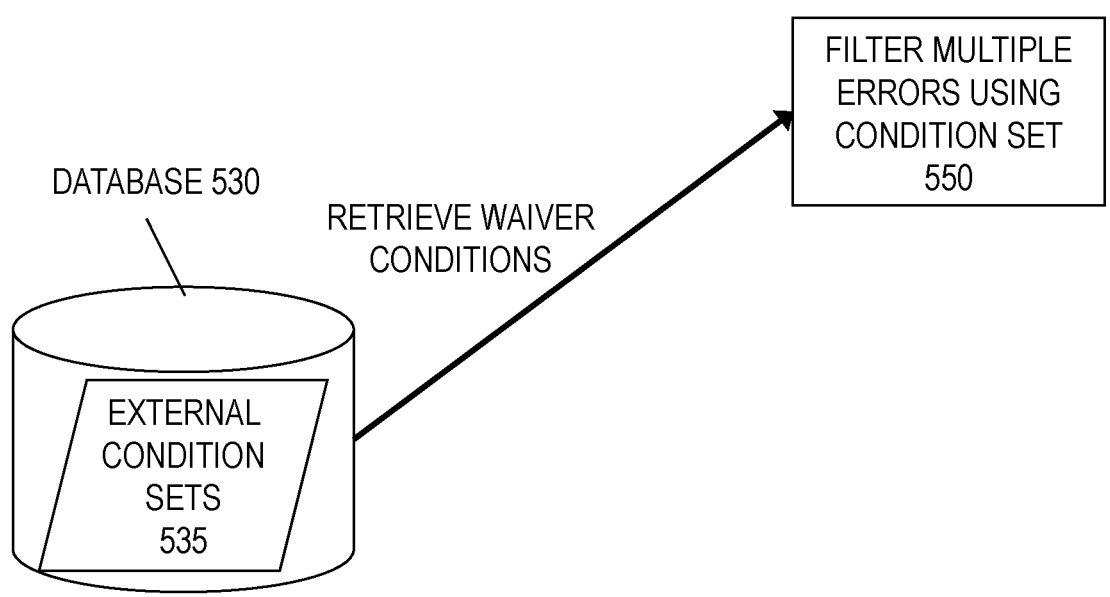
Figure 5G:
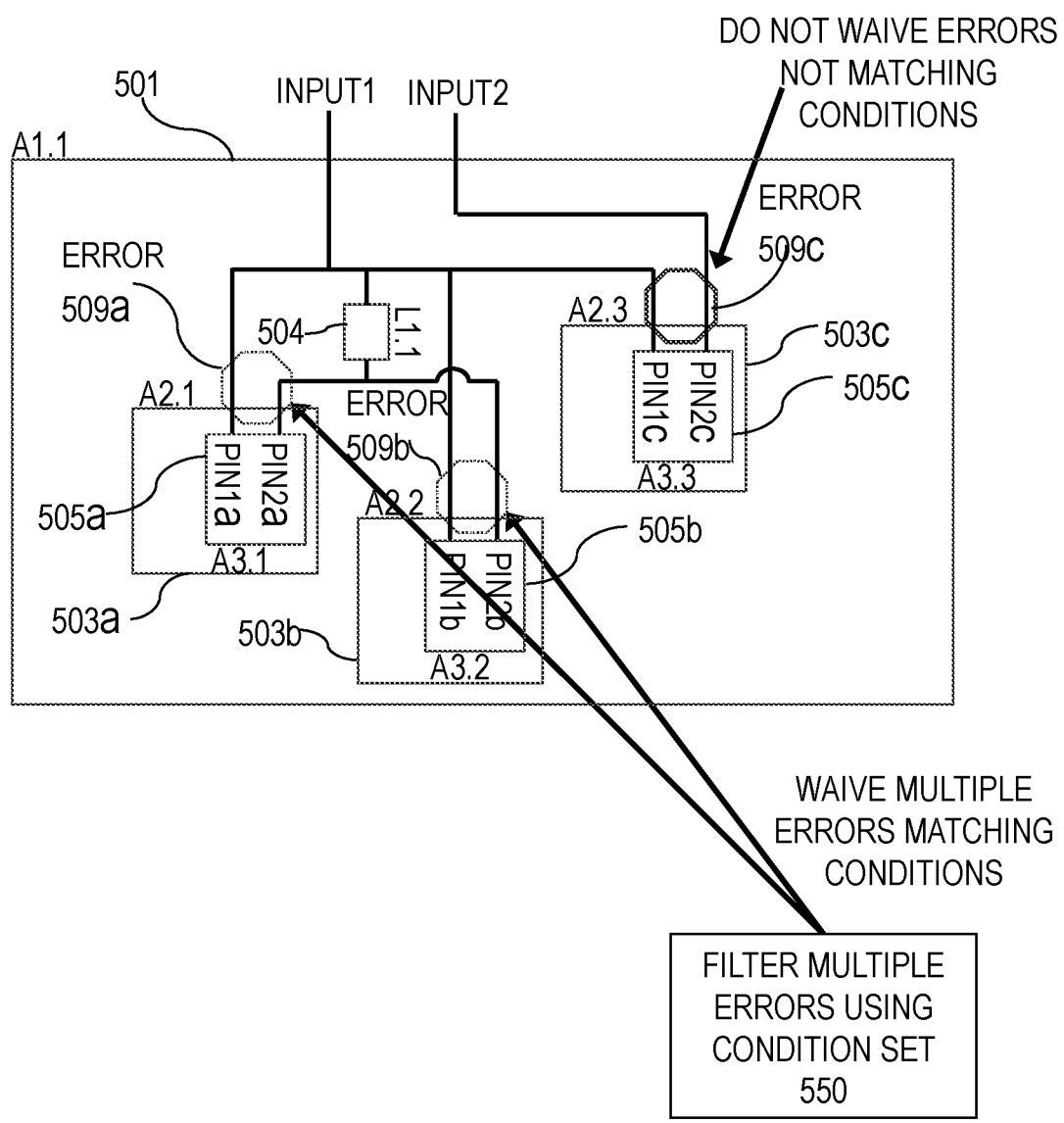

Once the conditions set(s) are registered as illustrated in FIG. 5E the process can continue either immediately or at some later time to waive multiple errors using the condition sets as illustrated in FIGS. 5F-G.

FIG. 5F illustrates the retrieval of waiver conditions (e.g. conditions associated with the under-voltage error previously discussed) by element 550 to provide for filtering of multiple errors using the conditions sets. This corresponds to 210 of FIG. 2 and FIG. 4 and may further include retrieval of one or more errors or warnings (either directly or indirectly) for applying the corresponding retrieved external condition set to generate waivers as appropriate.

Finally, FIG. 5G illustrates the result of the filtering using the external condition set to waive multiple errors matching the condition set. Here, element 550 waives errors 509a-b but not error 509c. As illustrated, the inputs to A2.1 and A2.2 are identical with respect to the shown inputs. Thus, presuming that the shown inputs are the relevant parameters for processing the external condition set(s) then A2.1 and A2.2 have matching conditions. However, A2.3 does not have the same inputs and is thus not waived in this example. FIG. 5G corresponds to 210 and 212 of FIG. 2, and to 404-412 of FIG. 4. In this way, the waiver based on the external conditions and hierarchy may be used to waive a plurality of errors where the external conditions and the hierarchy match.

System Architecture Overview

Figure 6:
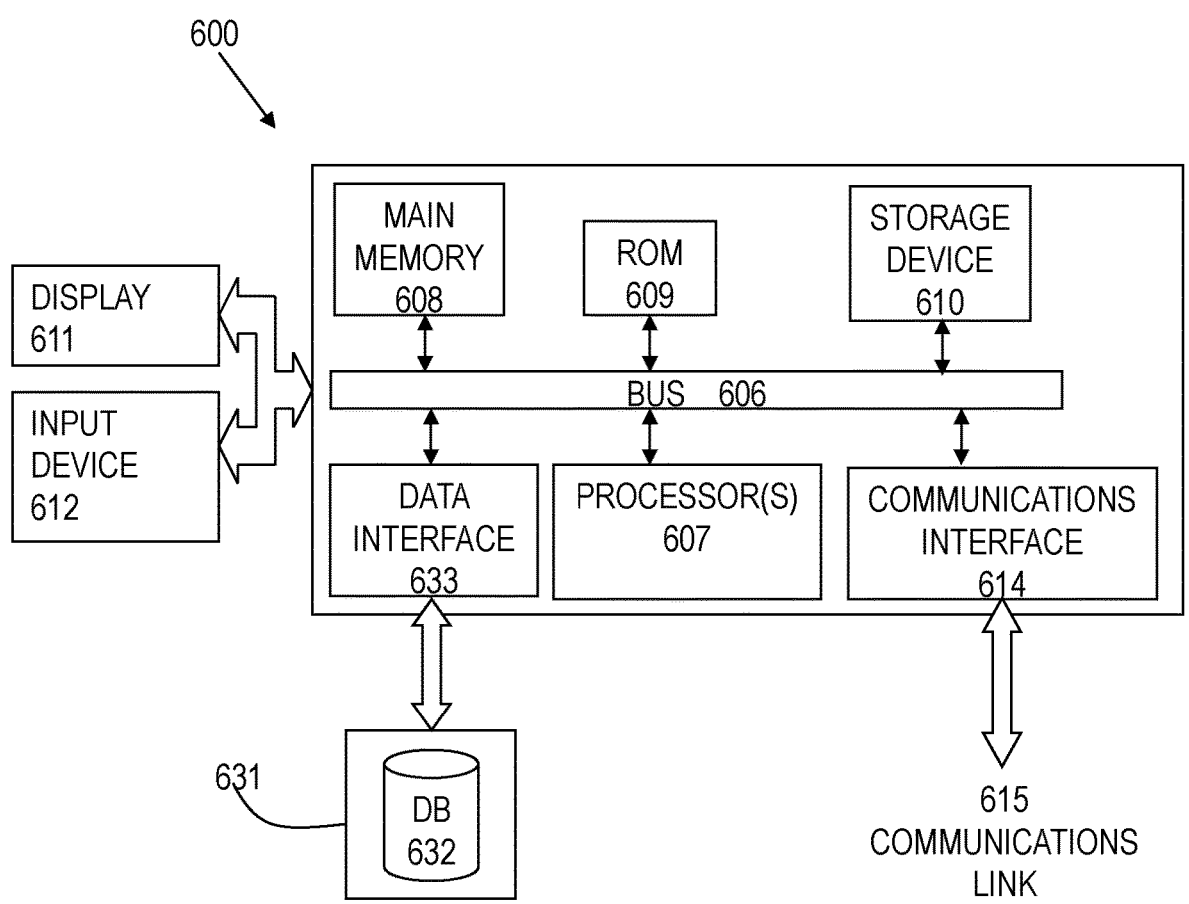
FIG. 6 shows an architecture of an example computing system with which the invention may be implemented.

FIG. 6 shows an architecture of an example computing system with which the invention may be implemented. Computer system 600 includes a bus 606 or other communication mechanism for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control.

According to one embodiment of the invention, computer system 600 performs specific operations by processor 607 executing one or more sequences of one or more instructions contained in system memory 608. Such instructions may be read into system memory 608 from another computer readable/usable medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. Computer system 600 may communicate through a data interface 633 to a database 632 on an external storage device 631.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for applying multiple waivers to design rule violations base on at least a single waiver, comprising:
   receiving an indication of a waiver of a first violation at a first block, the first block comprising an instance of a first block master;
   registering a set of conditions corresponding to the first block, the set of conditions comprising external conditions associated with the first block and a hierarchical relationship between the first block and one or more additional blocks, the one or more additional blocks comprising instances of other block masters; and
   waiving a plurality of violations for different instances of the first block master using the set of conditions.

2. The method of claim 1, further comprising:
   receiving or retrieving a circuit design;

analyzing the circuit design to identify violations, the violations comprising at least errors and warnings; and
displaying the violations where the violations matching the set of conditions are waived.

3. The method of claim 1, wherein registration of the set of conditions comprises identifying the first block master and storing the set of conditions in a database corresponding to the first block master, wherein the set of conditions are associated with first block master.

4. The method of claim 3, wherein the set of conditions comprise at least one or more parameters for one or more connections between the first block and external elements.

5. The method of claim 4, wherein the one or more parameters are selected based on any combination of inputs received with the indication of the waiver of the first violation, data corresponding to the first violation, or data previously associated with the first block master.

6. The method of claim 1, wherein waiving a plurality of violations for different instances of the first block master comprises:
processing each violation of the plurality of violations by:
determining that the violation is at a block that is an instance of the first block master,
determining that the first block master is associated with one or more registered sets of conditions for waiver,
determining that external conditions of the block match at least one of the registered sets of conditions for waiver of the violation, and
waiving the violation.

7. The method of claim 6, wherein processing each violation further comprises identifying one or more parameters for processing the registered sets of conditions for waiver of the violation and determining values of the one or more parameters, wherein determining that the conditions of the block match at least one of the registered sets of conditions for waiver of the violation comprises at least determining that the values of the one or more parameters satisfy at least one of the registered sets of conditions for waiver of the violation.

8. A computer program product that includes a computer readable medium, the computer readable medium comprising a plurality of computer instructions which, when executed by a processor, cause the processor to execute a process for applying multiple waivers to design rule violations base on at least a single waiver, the process comprising:
receiving an indication of a waiver of a first violation at a first block, the first block comprising an instance of a first block master;
registering a set of conditions corresponding to the first block, the set of conditions comprising external conditions associated with the first block and a hierarchical relationship between the first block and one or more additional blocks, the one or more additional blocks comprising instances of other block masters; and
waiving a plurality of violations for different instances of the first block master using the set of conditions.

9. The product of claim 8, further comprising:
receiving or retrieving a circuit design;
analyzing the circuit design to identify violations, the violations comprising at least errors and warnings; and
displaying the violations where the violations matching the set of conditions are waived.

10. The product of claim 8, wherein registration of the set of conditions comprises identifying the first block master and storing the set of conditions in a database corresponding to the first block master, wherein the set of conditions are associated with first block master.

11. The product of claim 10, wherein the set of conditions comprise at least one or more parameters for one or more connections between the first block and external elements.

12. The product of claim 11, wherein the one or more parameters are selected based on any combination of inputs received with the indication of the waiver of the first violation, data corresponding to the first violation, or data previously associated with the first block master.

13. The product of claim 8, wherein waiving a plurality of violations for different instances of the first block master comprises:
processing each violation of the plurality of violations by:
determining that the violation is at a block that is an instance of the first block master,
determining that the first block master is associated with one or more registered sets of conditions for waiver,
determining that external conditions of the block match at least one of the registered sets of conditions for waiver of the violation, and
waiving the violation.

14. The product of claim 13, wherein processing each violation further comprises identifying one or more parameters for processing the registered sets of conditions for waiver of the violation and determining values of the one or more parameters, wherein determining that the conditions of the block match at least one of the registered sets of conditions for waiver of the violation comprises at least determining that the values of the one or more parameters satisfy at least one of the registered sets of conditions for waiver of the violation.

15. A system for applying multiple waivers to design rule violations base on at least a single waiver, comprising:
a memory for storing instructions; and
a processor which performs the following actions when executing instructions:
identifying a waiver of a first violation at a first block, the first block comprising an instance of a first block master;
storing a set of conditions corresponding to the first block, wherein storing the set of conditions comprises at least registering the set of conditions, the set of conditions comprising external conditions associated with the first block and a hierarchical relationship between the first block and one or more additional blocks, the one or more additional blocks comprising instances of different block masters; and
waiving a plurality of violations for different instances of the first block master using the set of conditions.

16. The system of claim 15, further comprising:
receiving or retrieving a circuit design;
analyzing the circuit design to identify violations, the violations comprising at least errors and warnings; and
displaying the violations where the violations matching the set of conditions are waived.

17. The system of claim 15, wherein registration of the set of conditions comprises identifying the first block master and storing the set of conditions in a database corresponding to the first block master, wherein the set of conditions are associated with first block master.

18. The system of claim 17, wherein the set of conditions comprise at least one or more parameters for one or more connections between the first block and external elements.

19. The system of claim 18, wherein the one or more parameters are selected based on any combination of inputs received with the indication of the waiver of the first violation, data corresponding to the first violation, or data previously associated with the first block master.

20. The system of claim 15, wherein waiving a plurality of violations for different instances of the first block master comprises:
processing each violation of the plurality of violations by:
determining that the violation is at a block that is an instance of the first block master,
determining that the first block master is associated with one or more registered sets of conditions for waiver,
determining that external conditions of the block match at least one of the registered sets of conditions for waiver of the violation, and
waiving the violation, wherein processing each violation further comprises identifying one or more parameters for processing the registered sets of conditions for waiver of the violation and determining values of the one or more parameters, wherein determining that the conditions of the block match at least one of the registered sets of conditions for waiver of the violation comprises at least determining that the values of the one or more parameters satisfy at least one of the registered sets of conditions for waiver of the violation.

* * * * *